United States Patent [19]

Taniguchi et al.

[11] Patent Number: 5,238,783

[45] Date of Patent: Aug. 24, 1993

[54] PHOTOSENSITIVE POLYMER COMPOSITION FOR WATER DEVELOPABLE FLEXOGRAPHIC PRINTING PLATE

[75] Inventors: Masaharu Taniguchi, Shiga; Kenji Yoshimura, Ohtsu; Tetuo Suzuki, Kusatsu; Hisayosi Yamada; Shun-ichi Yanagida, both of Ohtsu, all of Japan

[73] Assignee: Toray Industries, Inc., Japan

[21] Appl. No.: 657,999

[22] Filed: Feb. 20, 1991

[30] Foreign Application Priority Data

Apr. 16, 1990 [JP] Japan .................... 2-99878
Apr. 20, 1990 [JP] Japan .................... 2-105880
Jun. 14, 1990 [JP] Japan .................... 2-156394

[51] Int. Cl.$^5$ .................... G03F 7/033; G03F 7/035; G03F 0/037
[52] U.S. Cl. .................... 430/281; 430/138; 430/906; 522/79; 522/78; 522/110
[58] Field of Search .................... 430/906, 281, 138; 522/79, 78, 110

[56] References Cited

U.S. PATENT DOCUMENTS

| | | | |
|---|---|---|---|
| 4,464,456 | 8/1984 | Fujikawa et al. | 430/281 |
| 4,889,793 | 12/1989 | Taniguchi et al. | 430/284 |
| 4,927,739 | 5/1990 | Taniguchi et al. | 430/281 |
| 4,956,252 | 9/1990 | Fryd et al. | 430/138 |

FOREIGN PATENT DOCUMENTS

| | | | |
|---|---|---|---|
| 0332983 | 9/1989 | European Pat. Off. | |
| 0351628 | 1/1990 | European Pat. Off. | 430/281 |
| 0367086 | 5/1990 | European Pat. Off. | |
| 1-219735 | 6/1989 | Japan . | |

*Primary Examiner*—Cynthia Hamilton
*Attorney, Agent, or Firm*—Austin R. Miller

[57] ABSTRACT

The present invention is concerned with a photosensitive polymer composition for a water-developable, flexographic printing plate, having a phase separating structure in a sea-and-islands state, the phase separating structure comprising island phases and a sea phase, the island phase comprising a thermoplastic elastomer component having a glass transition temperature lower than 25° C., and the sea phase comprising a gelled, ethylenically unsaturated compound component.

The photosensitive polymer composition of the present invention affords a printing plate capable of being developed with neutral water and suitable for flexographic printing using a water-based ink.

10 Claims, 4 Drawing Sheets

X1000

X1000

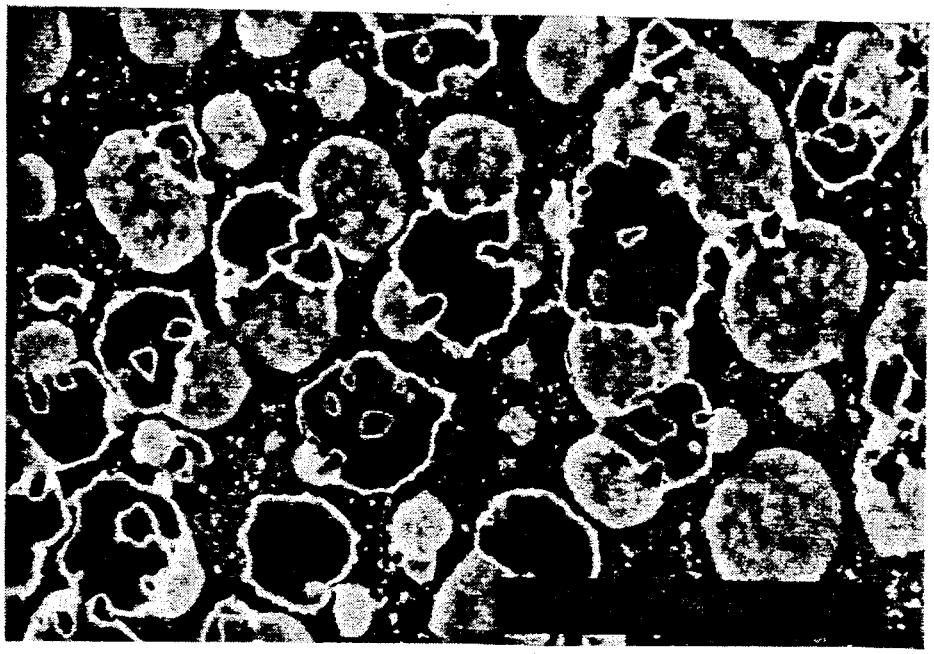
FIG. 3 X1000
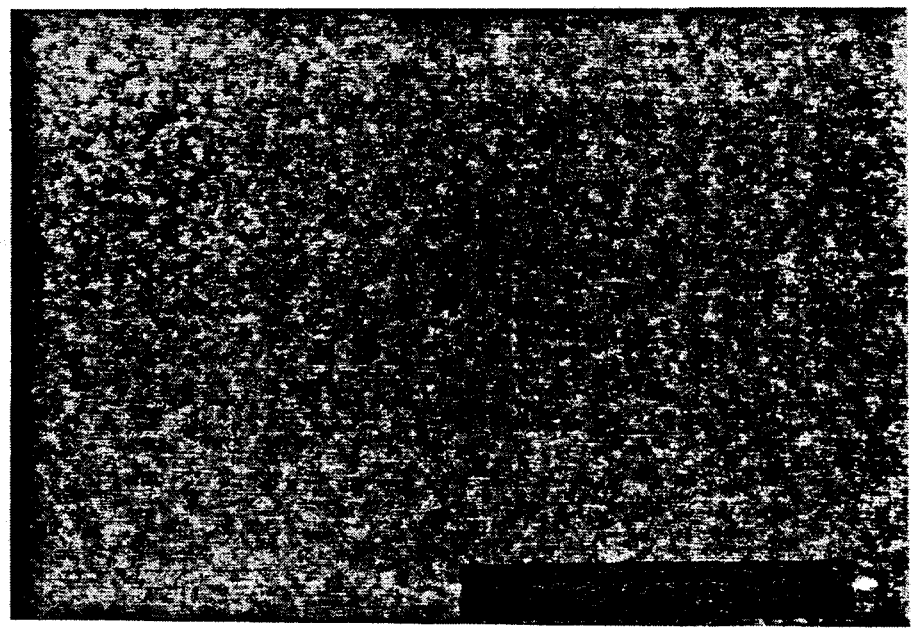
FIG. 4 X5000

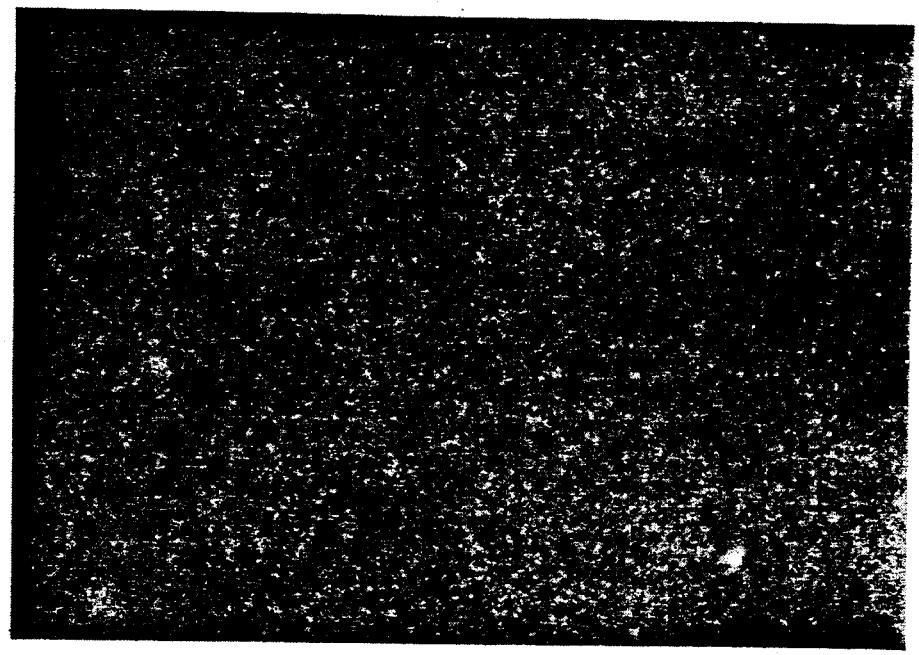
FIG. 5  X10000
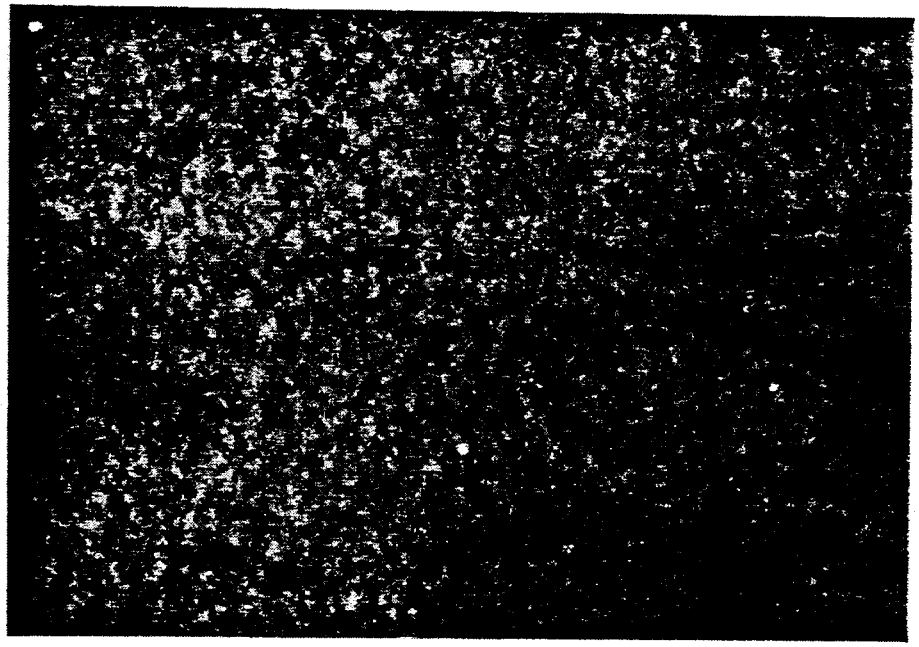
X10000
FIG. 6

X 10000

PHOTOSENSITIVE POLYMER COMPOSITION FOR WATER DEVELOPABLE FLEXOGRAPHIC PRINTING PLATE

BACKGROUND OF THE INVENTION (1) Field of the Invention

The present invention relates to a photosensitive polymer composition for a water developable flexographic printing plate and more particularly to a photosensitive polymer composition suitable for a solid photosensitive printing plate material which is developable with only neutral water and which affords a flexographic printing plate suitable for printing using a water-based ink.

(2) Description of the Prior Art

Photosensitive polymer compositions comprising an elastomer as a carrier component such as a chlorinated rubber, a styrene-butadiene block copolymer, or a polyurethane, as well as an ethylenically unsaturated compound and a photopolymerization initiator, are useful as flexographic printing plate materials, making the most of characteristics of the elastomer, and various proposals have been made as in U.S. Pat. Nos. 2,948,611 and 3,024,180 and Japanese Patent Publication No. 51-43374B.

Such solid photosensitive material for flexographing printing requires development using a halogenated hydrocarbon and involves problems such as health trouble and environmental pollution. Therefore, the development of a water developable, solid, photosensitive polymer for flexographic printing has been desired, and proposals are made with respect to photosensitive polymer compositions as materials for water developable, solid, photosensitive flexographic printing plates, for example, in U.S. Pat. Nos. 4,023,973; 4,177,074; 4,247,624; 4,272,608; 4,275,142; 4,415,649; 4,431,723; 4,446,220; 4,464,456; 4,517,279; and 4,689,290; and Japanese Patent Unexamined Publication (Kokai) No. 1-219735A.

However, it is difficult to satisfy all of high strength and water developability of a printing plate material, flexibility as a flexographic printing plate and adaptability to a water-based ink which is mainly used in flexographic printing. As such material of a printing plate there has not been obtained yet a satisfactory material in practical use. Particularly, in the development of a printing plate material, there has not been known a solid, photosensitive polymer material for a flexographic printing plate which exhibits a practical developability substantially in the use of neutral water alone.

In U.S. Pat. Nos. 4,889,793 and 4,927,739 it is shown that a water developable, solid, photosensitive, flexographic printing plate material is obtained from a photosensitive polymer composition prepared by solidifying a large amount of an ethylenically unsaturated compound with a polyamide as a polymeric gelling agent and/or a specific compound known usually as an oil gelling agent. However, by the methods described in these patents it has still been difficult to practically satisfy all of high strength and water developability of a printing plate material, flexibility as a flexographic printing plate and printability in the use of a water-base ink which is mainly used in flexographic printing.

SUMMARY OF THE INVENTION

It is the object of the present invention to remedy the above-mentioned drawbacks of the prior arts and to particularly provide a photosensitive polymer composition which can be developed with neutral water alone and affords a solid, photosensitive material for a practical flexographic printing plate suitable to water-based ink.

The present invention comprises a photosensitive polymer composition for a water-developable flexographic printing plate wherein a photosensitive layer has a phase separating structure in a sea-and-islands morphologic state, the islands component being a thermoplastic elastomer component having a glass transition temperature lower than 25° C., and the sea component being an ethylenically unsaturated compound component which is in a gelled state.

Having made studies for simultaneously attaining such contradictory characteristics as practical strength and water developability of a printing plate material, flexibility as a flexographic printing plate and printability in the use of a water-based ink, the present inventors found out that flexibility and water-based ink printability can be imparted to a flexographic printing plate by introducing an unknown phase separating structure in a sea-and-islands morphologic state into a photosensitive layer of a printing plate material, by using a lipophilic, thermoplastic elastomer as a main component of the island phase, and further using as a main component of the sea phase an ethylenically unsaturated compound gelled and solidified by a small amount of a hydrophilic resin serving as a polymeric gelling agent or by a compound usually known as an oil gelling agent. In this way we accomplished the present invention.

BRIEF DESCRIPTION OF THE DRAWINGS

FIGS. 1, 2 and 3 are sectional views each showing an example of a form of a photosensitive polymer composition for a flexographic printing plate material obtained according to the present invention; and FIGS. 4, 5, 6 and 7 are sectional views each showing a form of a conventional photosensitive polymer composition for a flexographic printing plate.

DESCRIPTION OF THE PREFERRED EMBODIMENTS

Figure 1:
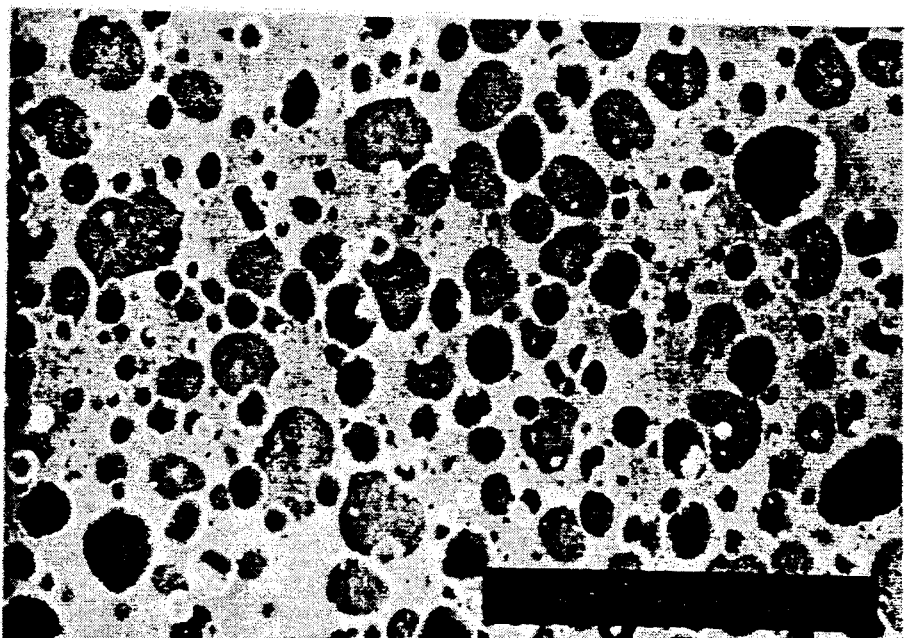

The phase separating structure in the sea-and-islands morphologic state in the photosensitive polymer composition of the present invention mainly comprises a sea phase which comprises one or more components and which is a continuous phase and island phases which comprise one or more components different from the component(s) of the sea phase. In any section of the photosensitive polymer composition, the island phase is dispersed substantially in the form of islands in the sea phase. The shape of the island phase is basically a circle or an ellipse in any section of the photosensitive polymer composition. In three dimensions, therefore, it can be presumed that the island phase is discontinuous and spherical.

The volume of such spheres of the island phases in the photosensitive polymer composition is preferably 5 to 70 vol %, more preferably 10 to 60 vol %, of the total volume. If it is smaller than 5 vol %, the improvement in printability of a flexographic printing plate to be attained by the present invention will not be made to a satisfactory extent in practical use, and if it is larger than 70 vol %, the water developability will be poor.

The main components of the sea and island phases are basically not compatible with each other, and the sea phase is uniform in composition throughout the phase because it is a continuous phase, while the island phase may comprise two or more different kinds of components.

In the photosensitive polymer composition of the present invention, a main component of at least one kind of island phase comprises a lipophilic, thermoplastic elastomer, but different island phases may be made present in a large number. Flexographic printing plate material and printing plate having such two or more kinds of island phases, obtained from the composition of the present invention, are superior in the balance of water developability and flexographic printability in the use of water-based ink.

In the present invention, the shape and size of the island phase dispersed in the form of islands in the sea phase are not specially limited. Preferably, not less than 50 vol %, more preferably not less than 70 vol %, of the whole island phase is in the form of independent spheres ranging in diameter from 50 to 1 $\mu$, more preferably 30 to 1 $\mu$, still more preferably 20 to 1 $\mu$. If the proportion of the island phases which is in the form of independent spheres is smaller than 50 vol %, it will become difficult to effect uniform development, resulting in that a relief shape of the printing plate obtained is unsatisfactory.

As the thermoplastic elastomer which is an essential component of the island phase in the photosensitive polymer composition of the present invention, there may be used a known thermoplastic elastomer which has a glass transition temperature lower than 25° C. and exhibits an elastic behavior at 25° C. Usually, a lipophilic elastomer is used in the present invention. As examples of such thermoplastic elastomer there are mentioned polybutadiene, polyisoprene, styrene-butadiene or styrene-isoprene block copolymer, diene-acryl compound copolymer, polychloroprenes, chlorinated polyolefins, epichlorohydrin rubber, chlorinated sulfonated polyolefins, elastomers of polyolefins or copolymers thereof, polyurethane elastomers, polyester elastomers, and polyamide, elastomers. Among these elastomers, polybutadiene, polyisoprene chlorine-containing elastomers and elastomers containing an alkylene oxide bond of $C_3$ or more are preferred. Particularly preferred are thermoplastic elastomers having a number average molecular weight of not less than 10,000 and containing as a soft segment a polyether segment having an alkylene oxide bond of $C_3$ or more.

Examples of thermoplastic elastomers containing alkylene oxide units include polyether ester elastomer, polyether ester amide elastomer, polyether urethane elastomer and polyether amide elastomer which are obtained by polycondensation or copolycondensation using, at least as a part of starting components, diols such as poly(1,2- or 1,3-propylene oxide) glycol, poly(-tetramethylene oxide) glycol, poly(hexamethylene oxide) glycol, as well as block and random copolymers thereof. But there is made no limitation thereto.

It is essential for the photosensitive polymer composition of the present invention to have an island phase comprising such thermoplastic elastomer(s). Preferably, the photosensitive polymer composition contains different kinds of island phases. Examples of main components of such different kinds of island phases include compounds which afford thermoplastic elastomers on photo-setting such as polyenes ranging in number average molecular weight from 500 to 20,000 and known as liquid rubbers, as well as modified compounds thereof, oligoester acrylates and oligourethane acrylates. Particularly preferred are addition reaction products obtained by an addition reaction of maleic anhydride-modified liquid polyenes such as maleic anhydride-modified polybutadienes or maleic anhydride-modified polyisoprenes with acrylates or methacrylates containing at least one hydroxyl group in the molecule, as well as liquid polyenes having acryloyl or methacryloyl group introduced in the ends thereof.

The sea phase in the photosensitive polymer composition of the present invention mainly comprises an ethylenically unsaturated compound as an essential component and, if necessary, a plasticizer and other additives which have both been gelled and solidified by a small amount of a resin component functioning as a polymeric gelling agent or by a gelling agent, preferably by both the resin component and the gelling agent.

The ethylenically unsaturated compound is not specially limited. Preferred examples are acrylates or methacrylates having one or more hydroxyl or carboxyl groups in the molecule and having a boiling point higher than 150° C., as well as organic acid anhydrides thereof, or derivatives thereof obtained by using amines.

As the aforementioned acrylates or methacrylates having one or more hydroxyl or carboxyl groups in the molecule and having a boiling point higher than 150° C. there may be used suitable known compounds which satisfy these conditions. But particularly preferred are those represented by the following formulae (1), (2), (3) and (4):

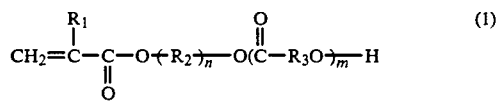

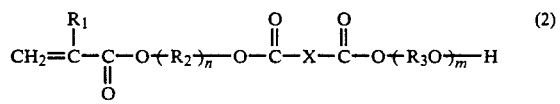

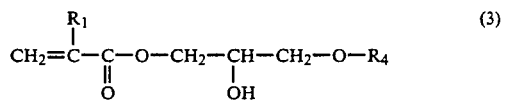

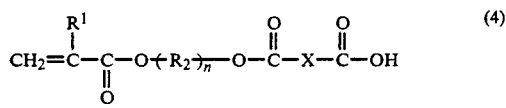

In the above formulae, $R_1$ is H or $CH_3$; $R_2$ is $CH_2CH_2$ or

$R_3$ is an alkylene group having 2 to 6 carbon atoms; $R_4$ is an alkyl group having 4 to 14 carbon atoms or an alkyl-substituted or unsubstituted phenyl group; X is a dicarboxylic acid residue, e.g. a hydrocarbon radical, having 4 to 12 carbon atoms; and n and m are each an integer of 1 to 10.

Examples of compounds represented by the above general formulae or derivatives thereof, which are employable in the present invention, include caprolactone-modified 2-hydroxyethyl methacrylate or caprolactone-modified 2-hydroxyethyl acrylate (both will hereinafter be referred to as "caprolactone-modified 2-hydroxyethyl (meth) acrylate" and the expression "(meth)acrylate" in the following description indicates both acrylate and methacrylate), caprolactone-modified 2-hydroxypropyl (meth)acrylate, ethylene oxide-modified phthalic acid (meth)acrylate such as β-hydroxyethyl β'-acryloyloxyethyl phthalate, propylene oxide-modified phthalic acid (meth)acrylate, 3-phenoxy-2-hydroxypropyl (meth)acrylate, 3-butoxy-2-hydroxypropyl (meth)acrylate, addition compounds obtained by an addition reaction of alkylene oxides or lactones to the hydroxyl groups of the compounds just exemplified above, as well as acid anhydride addition compounds obtained by such addition reaction, e.g. dicaprolactone-modified 2-hydroxyethyl (meth)acrylate, tricaprolactone-modified 2-hydroxyethyl (meth)acrylate, β-hydroxydi(ethyleneoxy)ethyl β'-acryloyloxyethyl phthalate, further, addition compounds prepared by an addition reaction of 2-hydroxyethyl (meth)acrylate and phtalic or succinic anhydride, and salts of carboxyl-containing (meth)acrylates out of the compounds exemplified above and tertiary amine compounds. But these examples constitute no limitation. Compounds represented by the foregoing general formulae and derivatives thereof are widely employable. Two or more of them may be used in combination. Also, these compounds and derivatives thereof may be used together with other mono(meth)acrylates and polyvalent (meth)acrylates.

In order to impart good water developability to a flexographic printing plate to be obtained in the present invention, it is preferable that at least a portion of the ethylenically unsaturated compound as a constituent of the sea phase in the photosensitive polymer composition and/or a plasticizer component as an optional component be a carboxylic acid salt. Particularly, tertiary amine salts of organic carboxylic acids are preferred.

As the carboxylic acid component in the carboxylic acid salt used as at least a portion of the ethylenically unsaturated compound in the above embodiment, there may be used any mono- or polyvalent carboxylic acids as salt forming carboxylic acids for tertiary amine compounds having one or more ethylenically unsaturated bonds. Examples of carboxylic acids which are employable preferably in conformity with the object of the present invention are such polyvalent carboxylic acids as maleic, fumaric, itaconic, mesaconic, adipic, sebacic, cyclohexane-1, 2-dicarboxylic, 4-methylcyclohexane-1, 2-dicarboxylic, isophtalic and 1, 2, 3, 4-butanetetracarboxlylic acids as well as acryloyl or methacryloyl group-containing compounds as derivatives thereof such as 2-acryloyloxyethyl phthalic acid, 2-methacryloyloxyethyl phthalic acid, 2-acryloyloxyethyl succinic acid, and 2-methacryloyloxyethyl succinic acid. But there is made no limitation thereto. As salt forming carboxylic acids for tertiary amine compounds not having an ethylenically unsaturated bond there may be used carboxylic acids having one or more ethylenically unsaturated bonds out of the carboxylic acids exemplified above.

As the carboxylic acid component in the carboxylic acid salt used at least as a portion of the plasticizer in the above embodiment, there is used a salt of a tertiary amine compound not having an ethylenically unsaturated bond and a carboxylic acid not having an ethylenically unsaturated bond out of the carboxylic acids exemplified above. As a salt forming substance in the carboxylic acid salt there may be used an alkali metal such as lithium, sodium, or calcium, but an amine compound is preferred. No special limitation is placed on amine compounds which may be used in the present invention, but tertiary amines are preferred. Particularly, it is desirable to use a method wherein a primary or secondary amine as a reactive additive is reacted with acrylates or methacrylates as the ethylenically unsaturated compound component in the step of preparing a stock solution of the photosensitive polymer composition of the present invention to obtain a tertiary amine. The tertiary amine compound thus obtained is useful even alone as the plasticizer component, but it is possible to simultaneously produce both a tertiary amine salt functioning as the plasticizer component after the formation of salt with the carboxylic acid component and a tertiary amine compound or salt functioning as the ethylenically unsaturated compound component.

As to the structure of a final tertiary amine compound in the photosensitive polymer composition of the present invention, a polyvalent amine having one or more hydroxyl groups in the molecule and having a molecular weight of not less than 300, preferably not less than 700 is preferred. Preferred examples are alkylglycidyl ether adducts and acrylate adducts obtained from isophoronediamine, metaxylylenediamine, triethylenetetramine, diethylenentriamine, and dimeric amide amine. These compounds can be prepared in accordance with the process disclosed in Japanese Patent Unexamined Publication (Kokai) Nos. 63-162660A and 1-69059A.

It is preferable that these tertiary amine compounds each at least partially be in the form of a carboxylic acid salt in the photosensitive polymer composition. This carboxylic acid salt is present mainly in the sea phase, but may also be present in the island phase in the case where the island phase has a carboxyl group.

The proportion of such carboxylic acid salt is preferably in the range of 10 to 70 wt %, more preferably 20 to 50 wt %, based on the weight of the entire photosensitive resin composition. A proportion thereof smaller than 10 wt % will result in poor water developability, and if it is larger than 70 wt %, the shape retaining property of the photosensitive polymer composition will be unsatisfactory.

The sea phase in the photosensitive polymer composition of the present invention is characterized in that it is solidified by gelation. More particularly, it is essential in the present invention that an ethylenically unsaturated compound which is liquid at room temperature is gelled and used as a solid, continuous phase. The gelation of such liquid can be effected by using various known gelling techniques. As the gelling agent there may be used any compound if only the compound is capable of dissolving at a temperature higher than about 100° C. when incorporated in the composition comprising the ethylenically unsaturated compound as a constituent of the sea phase and a plasticizer as an optional component and is also capable of solidifying the composition at room temperature. As examples of such gelling agent there are mentioned polymeric gelling agents and compounds usually known as oil gelling agents (oil gelling agent(s) are referred to simply as "gelling agent(s)" hereinafter) and capable of gelling various organic solvents.

In the sea phase of the photosensitive polymer composition of the present invention, the polymeric gelling agent and/or the gelling agent forms a support structure and solidifies the whole in the composition which is liquid and comprises an ethylenically unsaturated compound as a principal component. This solidified substance has a support structure forming point, i.e., a gelation point, usually at 50°-150° C., preferably 90°-140° C., and so it is clearly distinguished from conventional solid photosensitive polymer compositions using carrier resins. Conventional solid photosensitive polymer compositions possess melting points involving a uniform change of state, or in the case of a photosensitive resin composition not having a melting point, its melt viscosity exhibits a specific temperature dependence, substantially having no inflexion point.

The gelled substance in the present invention can be made into a liquid of 100 poise or lower usually at 100°-150° C.

As the polymeric gelling agent there is used a polymer having a number average molecular weight of not less than 10,000 and having in the molecule a functional group or bond which creates a strong hydrogen bond between molecules such as amide bond, hydroxyl group, or carboxyl group, or a polymer having partial crystallinity. The polymeric gelling agent is not specially limited if only it affords a water-developable sea phase. But, in view of the object of the present invention, it is desirable to use a copolyamide, particularly a polyether ester amide or a polyether amide both having a polyethylene oxide segment. An example thereof is shown in U.S. Pat. No. 4,889,793, which is incorporated herein by reference.

The amount of the polymeric gelling agent to be used is preferably in the range of 1 to 20 wt %, more preferably 2 to 10 wt %, based on the weight of the entire photosensitive polymer composition. If it is smaller than 1 wt %, the shape retaining property of the flexographic printing plate material obtained according to the present invention will be unsatisfactory, and a larger amount thereof than 20 wt % is apt to result in poor water resistance of the resulting printing plate.

Preferred examples of gelling agents employable in the present invention include 12-hydroxystearic acid, benzylidene sorbitols, benzylidene xylitols, and N-acylamino acid derivatives. More concrete and typical examples are 1, 3:2, 4-dibenzylidene sorbitol, 1, 3:2, 4:5, 6-tribenzylidene sorbitol, 1, 3:2, 4-p-p'-ditoluylidene sorbitol, 1, 3:2, 4-p-p'-diethylbenzylidene sorbitol, 1, 3:2, 4-dibenzylidene xylitol, and N-lauroyl-L-glutamic acid- α, γ-di-n-butylamide. But these examples constitute no limitation. Some of the gelling agents just exemplified above are disclosed in U.S. Pat. No. 4,927,739, which is incorporated herein by reference.

Such gelling agents contributes to the solidification of the ethylenically unsaturated compound and the plasticizer component mainly in the sea phase. But they may be contained in the island phase. Particularly, in the case where a liquid component is used as part of the island phase, the gelling agents contribute to the solidification thereof.

These gelling agents are used in an amount of 0.1 to 20 wt % based on the weight of the entire photosensitive polymer composition. If the amount thereof is smaller than 0.1 wt %, the shape retaining property of the flexographic printing plate material obtained according to the present invention will be unsatisfactory, and a larger amount thereof than 20 wt % is apt to result in poor printability of the resulting printing plate.

The polymeric gelling agents and gelling agents may each be used alone, but it is desirable to use them in combination.

As the photopolymerization initiator which is used for carrying out the photopolymerization of the photosensitive polymer composition of the present invention rapidly, there may be used any conventional compound. Examples are benzoinalkyl ethers, benzophenones, anthraquinones, benzils, acetophenones, and diacetyls. For enhancing the thermal stability of the photosensitive polymer composition there may be used any conventional polymerization inhibitor. Preferred examples of polymerization inhibitors include phenols, hydroquinones, catechols, and phenothiazine. As other additives there may be used dyes, pigments, surfactants, antifoaming agents, ultraviolet ray absorbers, perfumes, and plasticizers.

How to produce the solid, photo sensitive printing plate material wherein the photosensitive layer has a phase separating structure in the sea-and-islands morphologic state in the present invention is not specially limited. The printing plate material is produced on the basis of an appropriate balance between the constituents of the photosensitive layer and the method and conditions for preparing a stock solution as well as the method and conditions for molding. For example, a suitable method is selected from among a method involving melt-mixing and subsequent fluid spreading and cooling to form a film, a method involving melt-mixing and subsequent dry film formation, and a method involving kneading with a kneader and subsequent extrusion and forming with a compression roll.

According to a preferred method, resinous components such as a polymeric gelling agent and an elastomer are added into such liquid components as an ethylenically unsaturated compound and a plasticizer, then the temperature is raised to 70°-200° C., preferably 100°-180° C., under stirring to dissolve or melt and disperse the resinous components, and thereafter a photopolymerization initiator and other additives are mixed and dissolved therein to prepare a dissolved or melted dispersion substantially containing no solvent. A primary or secondary amine compound as a reactive additive may be added and reacted at this stage. Then the liquid composition thus obtained is spread over a support or cover film, then cooled and solidified.

In order to disperse a lipophilic elastomer component as a uniform island phase, the use of a compound which exhibits a surfactant action as an additive and an effective stirring both in the stock solution preparing step are effective. Particularly, it is desirable to use a carboxylated polyoxyethylene lauryl ether or a derivative thereof such as a tert-amine salt.

As a support for the printing plate material of the present invention there is used, for example, a metallic plate such as steel, stainless steel, aluminum or copper plate, which may have an adhesive layer if necessary, a plastic sheet such as a polyester film, or a synthetic rubber sheet. The photosensitive layer is formed usually at a thickness of 0.1 to 10 mm and it is preferable that a water-soluble or -dispersible protective film of 0.01-10μ be formed on the upper surface of the photosensitive layer.

For forming a printing relief image the printing plate material of the present invention, a negative or positive original film is brought into close contact with the upper surface of the photosensitive layer prepared as above and an ultraviolet light having a wave length of usually 300 to 450 mμ is radiated thereto using a high pressure mercury lamp, an ultra-high pressure mercury lamp, a metal halide lamp, a xenon lamp, a chemical lamp, or a carbon arc lamp, thereby allowing a photoreaction to take place for curing. Subsequently, an uncured portion is dissolved out or dispersed in water using a spray type or brush type developing apparatus, whereby a relief is formed on the support, followed by drying and post-exposure to obtain a flexographic printing plate.

The printing plate material obtained from the photosensitive polymer composition of the present invention permits development at room temperature using neutral water. For the purpose of increasing the developing speed, the development may be conducted using heated water, or a small amount of a surfactant may be used.

The photosensitive polymer composition of the present invention is used for obtaining a solid, photosensitive, flexographic printing plate material which is water-developable and which possesses such water developability, resistance to flexographic ink solvent and printability as are not attained by the prior art.

The present invention will be described in detail hereinunder in terms of working and comparative examples. Morphological photographs used in the present invention represent composition images of reflected electron images obtained by completely curing and fixing the photosensitive layer of each solid, photosensitive printing plate material using an ultraviolet light, dyeing a sliced section thereof with osmic acid, followed by measurement at an acceleration voltage of 10 KV using a scanning electron microscope (JSM-T300, a product of Japan Electron Optics Laboratory Co., Ltd.). Magnification will be shown for each image.

The "part" or "parts" used in the following examples are by weight.

SYNTHESIS EXAMPLE 1

A polyether amide comprising the following components was prepared in accordance with a known method (e.g. Japanese Patent Laid Open No. 79437/1980):

ε-caprolactam/equimolar salt of hexamethylenediamine and adipic acid/equimolar salt of α, ω-diaminopropyl polyoxyethylene (number average molecular weight: 1,000) and adipic acid=20/20/60

End groups of the polyether amide obtained were determined quantitatively to find that primary amino groups and carboxyl groups were $4.0 \times 10^{-5}$ mol/g and $2.1 \times 10^{-5}$ mol/g, respectively. Number average molecular weight determined by the end group determining method was about 33,000. Glass transition temperature was $-45°$ C.

SYNTHESIS EXAMPLE 2

A polyether ester amide comprising the following components was prepared in accordance with a known method (e.g. Japanese Patent Unexamined Publication (Kokai) No. 58-117537A:

ε-caprolactam/a mixture of polyethylene glycol having a number average molecular weight of 1,000 and equimolar terephtalic acid=40/70

A GPC number average molecular weight in terms of nylon 6, 6 of the polyether ester amide obtained was 28,000, and carboxyl groups were $2.9 \times 10^{-5}$ mol/g. Glass transition temperature was $-47°$ C.

SYNTHESIS EXAMPLE 3

A polyether ester amide elastomer comprising the following components was prepared in accordance with a known method (e.g. Japanese Patent Publication No. 372/1990):

laurolactam/a mixture of poly(tetra methylene oxide) glycol having a number average molecular weight of 650 and equimolar adipic acid=40/70

A GPC number average molecular weight in terms of nylon 6, 6 of the polyether ester amide elastomer obtained was 25,000, and carboxyl glass transition temperature was $-72°$ C.

SYNTHESIS EXAMPLE 4

A polyether ester amide elastomer comprising the following components was prepared in accordance with a known method (e.g. Japanese Patent Publication No. 372/1990):

laurolactam/a mixture of poly(propylene oxide) glycol having a number average molecular weight of 1,000 and equimolar adipic acid A GPC number average molecular weight in terms of nylon 6, 6 of the polyether ester amide elastomer obtained was 22,000, and glass transition temperature was $-63°$ C.

SYNTHESIS EXAMPLE 5

A polyether ester elastomer comprising the following components was prepared in accordance with a known method (e.g. Japanese Patent Laid Open No. 29826/1973):

dimethyl terephtalate/dimethyl isophthalate: 70/30 (weight ratio) and equal amount of polytetramethylene glycol/1, 4-butanediol: 50/40 (weight ratio)

GPC number average molecular weight in terms of polystyrene of the polyether ester obtained was 28,000, and glass transition temperature was $-60°$ C.

SYNTHESIS EXAMPLE 6

As a reactive additive component there was prepared an addition compound using 1 mol of isophorone diamine and 1 mol of 2-ethylhexyl glycidyl ether (reaction: 70° C., 3 hours).

EXAMPLE 1

10 parts of the polyether amide obtained in Synthesis Example 1, 12 parts of the polyether ester amide elastomer obtained in Synthesis Example 3, 0.05 part of hydroquinone as a heat stabilizer, 15 parts of caprolactone-modified 2-hydroxyethyl methacrylate, 23 parts of β-hydroxyethyl β'-acryloyloxyethyl phtalate, 10 parts of 2-acryloyloxyethyl hexahydrophthalic acid and 20 parts of maleic anhydride-modified polybutadiene "M2000-20" (a product of Nippon Petrochemicals Co., Ltd.) were mixed together and heated. After stirring at 105° C. for 1 hour, 10 parts of the additive prepared in Synthesis Example 6 was added, and after stirring at 140° C. for 1 hour, 1.5 parts of benzyldimethyl ketal as a photopolymerization initiator, as well as 7 parts of carboxylated penta(oxyethylene) lauryl ether, 5 parts of dibenzylidene sorbitol and 5 parts of N-lauroyl-L-glutamic acid-α,γ-di-n-butylamide as other additives were added and dissolved. The resulting solution was spread at a photosensitive layer thickness of 1,700μ over a 100μ thick polyester base onto which had been applied and cured a polyester-based adhesive, followed by standing at room temperature, to obtain a solid, photosensitive printing plate material.

A morphologic state of the photosensitive layer of this printing plate material is as shown in FIG. 1. In the same figure there is illustrated a phase separating structure in a sea-and-islands state containing two or more kinds of island structures. As a result of a fine structure analysis, it turned out that a principal component a black island phase and that of a gray island phase were the M2000-20 derivative and the polyether ester amide elastomer, respectively.

A sensitivity determining gray-scale negative film (21 steps Sensitivity Guide, a product of Stouffer Co.) and an image reproducibility evaluating negative film (150 lines, 3%, 5% and 10% halftone dots, 200μ and 300μ dia. independent dots, 50μ and 70μ fine lines) were brought into close contact in vacuum with the upper surface of the photosensitive layer of the printing plate material and then exposed to light at a distance of 1 m for 3 minutes, using an ultra-high pressure mercury lamp of 2 KW.

Thereafter, development was performed using a brush type developing apparatus containing neutral water (water temperature: 25° C.). After the development for 4 minutes, a relief image having a depth of 1,000μ was formed. The relief image was examined to reveal that up to 14 steps remained in the gray-scale portion and that 5% halftone dots, 300μ independent dots and 50μ fine lines were reproduced almost completely in the printing area. The printing plate thus obtained had a Shore A hardness of 60 after the completion of post-exposure using an active light ray. Using this printing plate and a water-based ink, a flexographic printing test was conducted for 7,000 sheets of paper to obtain good prints. More specifically, in this printing test there were used "Markandy SDG12-S" flexographic label printer (a product of Markandy Co.) and a water-based ink (a product of G man Co.).

EXAMPLE 2

A photosensitive printing plate material was prepared in the same way as in Example 1 except that 5 parts of the polyether ester amide prepared in Synthesis Example 2 was used in place of 10 parts of the polyether amide used in Synthesis Example 1 and that the amount of the polyether ester amide elastomer prepared in Synthesis Example 3 was changed to 17 parts.

Figure 2:
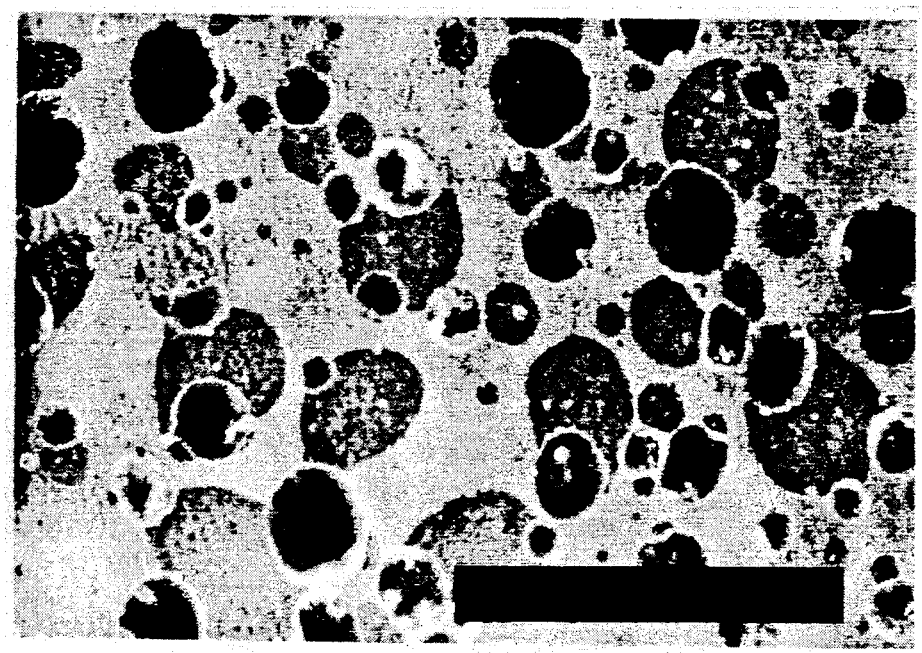

The photosensitive layer of this printing plate material is in such a morphologic state as shown in FIG. 2. In the same figure there is illustrated a phase separating structure in a sea-and-islands morphologic state. As a result of a fine structure analysis, it turned out that a principal component of a black island phase and that of a gray island phase were the M2000-20 derivatives and the polyether ester amide elastomer, respectively. Then, a printing plate was obtained from this photosensitive printing plate material in the same manner as in Example 1. Using this printing plate, there was conducted a printing test of 10,000 sheets of paper in the same manner as in Example 1 to obtain good prints.

EXAMPLE 3

The procedure of Example 1 was repeated except that the elastomer prepared in Synthesis Example 4 was used in place of the elastomer obtained in Example 3. There were obtained about the same results. FIG. 3. shows a morphologic state of the photosensitive layer formed.

COMPARATIVE EXAMPLE 1

20 parts of the polyether amide prepared in Synthesis Example 1 was added to a mixture consisting of 0.05 part of hydroquinone as a heat stabilizer, 15 parts of caprolactone-modified 2-hydroxyethyl methacrylate and 55 parts of β-hydroxyethyl β'-acryloyloxyethyl phtalate, followed by heating. After stirring at 105° C. for 1 hour, 10 parts of the additive shown in Synthesis Example 6 was added, and then after stirring at 140° C. for 1 hour, 1.5 parts of benzyldimethyl ketal as a photopolymerization initiator was added and dissolved. The resulting solution was spread at a photosensitive layer thickness of 1,700μ over a 100μ thick polyester base onto which had been applied and cured a polyester-based adhesive, followed by standing at room temperature, to obtain a solid, photosensitive printing plate material.

The photosensitive layer of this printing plate material is in such a morphologic state as shown in FIG. 4, which illustrates a substantially uniform structure.

From this photosensitive printing plate material there was produced a printing plate in the same manner as in Example 1. Using this printing plate, there was conducted a printing test in the same way as in Example 1; as a result, a marked thickening was observed in the printing area of the prints obtained.

COMPARATIVE EXAMPLE 2

"CYREL" (a product of DUPONT), which is a commercially available, halogenated hydrocarbon-developable, photosensitive printing plate material, has a photosensitive layer in such a morphologic state as shown in FIG. 5. In the same figure there is illustrated a substantially uniform structure. A flexographic printing plate obtained form this printing plate material has a superior printability, but does not have water developability.

COMPARATIVE EXAMPLE 3

"TORELIEF" WSS (a product of Toray Industries Inc.), which is a commercially available, water-developable, photosensitive printing plate material, has a photosensitive layer in such a morphologic state as shown in FIG. 6. In the same figure there is illustrated a substantially uniform structure. A printing plate obtained from this printing plate material does not have printability in the use of water-based ink.

COMPARATIVE EXAMPLE 4

Figure 7:
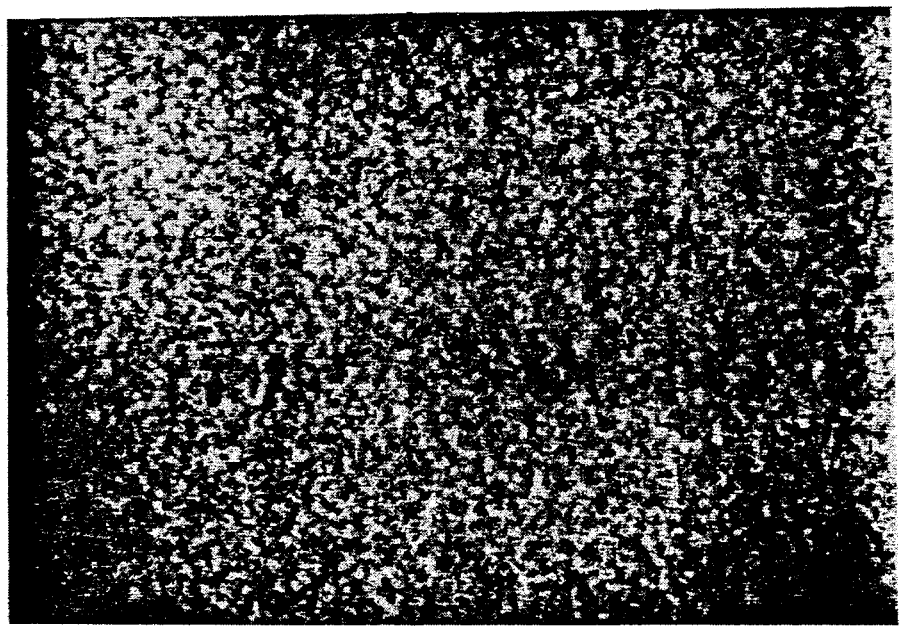

"APR FP60" (a product of Asahi Chemical Industry Co., Ltd.), which is a commercially available, liquid, photosensitive printing material, has a photosensitive layer in such a morphologic state as shown in FIG. 7. In the same figure there is illustrated a substantially uniform structure. This printing plate material is liquid.

EXAMPLE 4

25 parts of the polyether ester amide elastomer prepared in Synthesis Example 3, 0.05 part of hydroquinone as a heat stabilizer, 15 parts of caprolactone-modified 2-hydroxyethyl methacrylate, 15 parts of β-hydroxyethyl β'-acryloyloxyethyl phtalate, 5 parts of urethane acrylate ("XP2000B," a product of Nippon Gosei Co.), 10 parts of sebacic acid and 20 parts of maleic anhydride-modified polybutadiene "M2000-20" (a product of Nippon Petrochemicals Co., Ltd.) were mixed together and heated. After stirring at 105° C. for 1 hour, 10 parts of the additive shown in Synthesis Example 6 was added, and then after stirring at 140° C. for 1 hour, 1.5 parts of benzyl dimethyl ketal, as well as 4 parts of carboxylated tetra(oxyethylene) lauryl ehter, 5 parts of dibenzylidene sorbitol and 3 parts of N-lauroyl-L-glutamic acid-α,γ-di-n-butylamide as other additives were added and dissolved. The resulting solution was spread at a photosensitive layer thickness of 1,700μ over a 100μ thick polyester base onto which had been applied and cured a polyester-based adhesive, followed by standing at room temperature, to obtain a solid, photosensitive printing plate material.

The photosensitive layer of this printing plate material is in the same morphologic state as in Example 1, having a phase separating structure in a sea-and-islands state containing two or more kinds of substantially uniform island structures.

A sensitivity determining gray-scale negative film (21 steps Sensitivity Guide, a product of Stouffer Co.) and an image reproducibility evaluating negative film (150 lines, 3%, 5% and 10% halftone dots, 200μ and 300μ independent dots, 50μ and 70μ fine lines) were brought into close contact in vacuum with the upper surface of the photosensitive layer of the printing plate material and then exposed to light at a distance of 1 m for 3 minutes, using an ultra-high pressure mercury lamp of 2 KW.

Thereafter, development was performed using a brush type developing apparatus containing neutral water (water temperature: 30° C.). After the development for 8 minutes, a relief image having a depth of 1,000μ was formed. The relief image was examined to reveal that up to 13 steps remained in the gray-scale portion and that 5% halftones dots, 300μ independent dots and 50μ fine lines were reproduced almost completely in the printing area. The printing plate thus obtained had a Shore A hardness of 60 after the completion of post-exposure using an active light ray. Using this printing plate and a water-based ink, a flexographic printing test was conducted for 500,000 sheets of paper to obtain good prints.

COMPARATIVE EXAMPLE 5

A photosensitive printing plate material not containing a lipophilic, thermoplastic elastomer was prepared in the same way as in Example 4 except that the polyether amide obtained in Synthesis Example 1 was used in place of the polyether ester amide elastomer prepared in Synthesis Example 3. According to a morphologic state diagram of the photosensitive layer of this printing plate material, there is shown a phase separating structure in a sea-and-islands morphologic state having an island structure. However, the island phase comprises the M2000-20 derivative. In a printing plate obtained from this printing plate material, thickening was observed in the printing area of prints obtained in the same printing test as in Example 1.

COMPARATIVE EXAMPLE 6

A photosensitive printing plate material was prepared in the same way as in Example 4 except that the gelling agents of 5 parts dibenzylidene sorbitol and 3 parts N-lauroyl-L-glutamic acid-α,γ-di-n-butylamide were not used. However, this printing plate material did not have a practical shape retaining property as a solid printing plate material.

COMPARATIVE EXAMPLE 7

A photosensitive printing plate material was prepared in the same way as in Example 4 except that 10 parts of the additive shown in Synthesis Example 6 was not used. However, the water developing speed of this printing plate material was about one fifth of that of the printing plate material obtained in Example 4.

EXAMPLE 5

3 parts of the polyether amide prepared in Synthesis Example 1 and 20 parts of the polyether ester elastomer prepared in Synthesis Example 5 were added to a mixture consisting of 20 parts of β-hydroxyethyl β-acryloyloxyethyl phthalate, 12 parts of sebacic acid, 0.05 part of hydroquinone as a heat stabilizer, 15 parts of caprolactone-modified 2-hydroxyethyl methacrylate and 20 parts of liquid rubber "Nisseki Polybutadiene B2000-20" (a liquid polybutadiene, a product of Nippon Petrochemicals Co., Ltd.), followed by heating under stirring. After stirring at 110° C. for 1 hour, the additive prepared in Synthesis Example 6 was added, and after further heating and stirring at 140° C. for 1 hour, 1.5 parts of benzyl dimethyl ketal as a photopolymerization initiator, 5 parts of carboxylated tetra(oxyethylene) lauryl ether as an additive, as well as 2 parts of 12-hydroxystearic acid and 5 parts of dibenzylidene sorbitol both as gelling agent components, were added and dissolved. The resulting solution was spread at a photosensitive layer thickness of 1,500μ over a 100μ thick polyester base onto which had been applied and cured a polyester-based adhesive, followed by standing at room temperature, to obtain a solid, photosensitive printing plate material.

From this printing plate material there was obtained a printing plate in the same manner as in Example 1. The printing plate thus obtained had a Shore A hardness of 64 and it was an excellent flexographic printing plate suitable for water-based ink.

The photosensitive layer of this printing plate material is in the same morphologic state as in Example 1, having a phase separating structure in a sea-and-islands state containing two or more kinds of substantially uniform island structures.

EXAMPLE 6

A printing plate material was prepared in the same way as in Example 4 except that the amount of the maleic anhydride-modified polybutadiene "M2000-20" (a product of Nippon Petrochemicals Co., Ltd.) was changed into 10 parts and that 10 parts of chlorinated polyethylene "Daisolac H135" (a product of Daiso Co., Ltd) having average molecular weight of 200,000 was further used. From this printing plate material there was obtained a printing plate in the same manner as in Example 4. The printing plate thus obtained is more suitable for printing using a flexographic ink than the printing plate obtained in Example 4, and in a printing test for 100,000 sheets of paper using a water-based ink, it afforded good prints.

EXAMPLE 7

A printing plate material was prepared in the same way as in Example 4 except that the amount of the maleic anhydride-modified polybutadiene "M2000-20" (a product of Nippon Petrochemicals Co., Ltd.) was changed into 10 parts and that 10 parts of a crystalline polybutadiene having a number average molecular weight of 92,000 was further used. From this printing plate material there was obtained a printing plate in the same manner as in Example 4. The printing plate thus obtained was also more suitable for printing using a flexographic ink than the printing plate obtained in Example 4, and in a printing test for 100,000 sheets of paper using a water-based ink, it afforded good prints.

EXAMPLE 8

A printing plate material having about the same characteristic as that of the printing plate obtained in Example 4 was prepared in the same way as in Example 4 except that 10 parts of dimeric amide amine ("Versamine 551," a product of Henkel-Hakusui Co.) was used in place of 10 parts of the additive shown in Synthesis Example 6.

EXAMPLE 9

A printing plate material having about the same characteristic as that of the printing plate obtained in Example 4 was prepared in the same way as in Example 4 except that 10 parts of 4-methylhexanhydrophtalic acid was used in place of 10 parts of sebacic acid.

What is claimed is:

1. A photosensitive polymer composition for a water-developable, flexographic printing plate which consists essentially of a phase separating structure in a sea-and-islands morphologic state, said phase separating structure comprising island phases and a sea phase, said island phases comprising a thermoplastic elastomer component having a glass transition temperature lower than 25° C., and said sea phase comprising an ethylenically unsaturated compound component gelled with at least one gelling agent component selected from the group consisting of copolyamide having a polyethylene oxide segment, 12-hydroxystearic acid, benzylidene sorbitols, benzylidene xylitols, and N-acylamino acid amides selected from the group consisting of N-acrylamino amides, N-acylamino amine salts and N-acylamino acid esters.

2. A photosensitive polymer composition as set forth in claim 1, wherein the total volume occupied by said island phase is in the range of 5 to 70% by volume of the total volume of the photosensitive polymer composition.

3. A photosensitive polymer composition as set forth in claim 1, wherein said thermoplastic elastomer component contains at least one elastomer having polyether segments which comprise alkylene oxide units each having not less than 3 carbon atoms.

4. A photosensitive polymer composition as set forth in claim 3, wherein said elastomer having said polyether segment is a polyester amide or a polyamide.

5. A photosensitive polymer composition as set forth in claim 1, wherein said phase separating structure has two or more kinds of island phases not compatible with each other.

6. A photosensitive polymer composition as set forth in claim 5, wherein at least one of said two or more kinds of incompatible island phases contains as a main component a liquid rubber 7. A photosensitive polymer composition as set forth in claim 1, wherein said sea phase comprises said ethylenically unsaturated compound component represented by the following general formulae (1), (2), (3) and (4), or derivatives thereof:

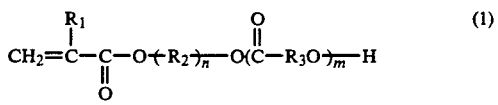

(1)

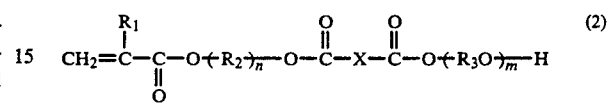

(2)

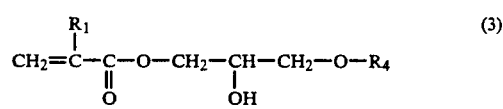

(3)

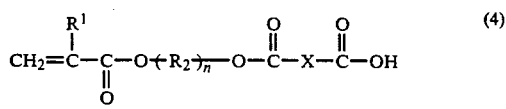

(4)

where $R_1$ is H or $CH_3$; $R_2$ is $CH_2CH_2$ or

$R_3$ is an alkylene group having 2 to 6 carbon atoms; $R_4$ is an alkyl group having 4 to 14 carbon atoms or an alkyl-substituted or unsubstituted phenyl group; X is a dicarboxylic acid radical having 4 to 12 carbon atoms; and n and m are each an integer of 1 to 10.

8. A photosensitive polymer composition as set forth in claim 1, wherein said sea phase contains an organic carboxylic acid salt.

9. A photosensitive polymer composition as set forth in claim 1, containing a polyvalent amine, said polyvalent amine having one or more hydroxyl groups in the molecule and having a molecular weight of not less than 300.

10. A photosensitive polymer composition as set forth in claim 1, wherein said thermoplastic elastomer component is selected from the group consisting of polybutadiene, polyisoprene, styrene-butadiene or styrene-isoprene block copolymer, diene-acryl compound copolymer, polychloroprenes, chlorinated polyolefins, epichlorohydrin rubber, chlorinated sulfonated polyolefins, polyurethane elastomers, polyester elastomers, and polyamide elastomers.

* * * * *